US008737130B2

(12) United States Patent
D'Abreu et al.

(10) Patent No.: US 8,737,130 B2
(45) Date of Patent: May 27, 2014

(54) SYSTEM AND METHOD OF DETERMINING A PROGRAMMING STEP SIZE FOR A WORD LINE OF A MEMORY

(75) Inventors: Manuel Antonio D'Abreu, El Dorado Hills, CA (US); Dimitris Pantelakis, Santa Clara, CA (US); Stephen Skala, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 162 days.

(21) Appl. No.: 13/408,021

(22) Filed: Feb. 29, 2012

(65) Prior Publication Data

US 2013/0223151 A1    Aug. 29, 2013

(51) Int. Cl.
*G11C 16/04*    (2006.01)

(52) U.S. Cl.
USPC ............ 365/185.18; 365/185.24; 365/185.29; 365/189.09; 365/189.12

(58) Field of Classification Search
USPC ............. 365/185.18, 185.24, 185.29, 189.09, 365/189.12
See application file for complete search history.

(56) References Cited

U.S. PATENT DOCUMENTS

| 6,760,807 | B2 * | 7/2004 | Brant et al. .................... 711/114 |
| 6,831,865 | B2 * | 12/2004 | Chang et al. ............. 365/185.33 |
| 7,649,777 | B2 | 1/2010 | Ichige et al. |
| 7,796,343 | B2 * | 9/2010 | Takehisa et al. .............. 359/649 |
| 7,952,922 | B2 | 5/2011 | Aritome |
| 8,248,848 | B1 * | 8/2012 | Tang et al. ............... 365/185.03 |
| 8,464,132 | B2 * | 6/2013 | Chen et al. .................... 714/763 |
| 2003/0107919 | A1 | 6/2003 | Yano et al. |
| 2003/0151950 | A1 | 8/2003 | Tamada et al. |
| 2005/0078513 | A1 | 4/2005 | Tatsukawa et al. |
| 2010/0017650 | A1 * | 1/2010 | Chin et al. ........................ 714/6 |
| 2011/0131473 | A1 | 6/2011 | Mokhlesi et al. |
| 2011/0141808 | A1 | 6/2011 | Haratsch et al. |
| 2012/0124302 | A1 * | 5/2012 | Kim et al. ..................... 711/154 |

OTHER PUBLICATIONS

International Search Report and Written Opinion mailed Jun. 6, 2013 in International Application No. PCT/US2013/023560, 11 pages.

* cited by examiner

*Primary Examiner* — Pho M Luu
(74) *Attorney, Agent, or Firm* — Toler Law Group, PC

(57) ABSTRACT

A method includes determining a programming step size for a word line of a memory in a data storage device. The programming step size is determined at least partially based on a count of memory elements of the word line to be programmed to a particular state.

19 Claims, 4 Drawing Sheets

SYSTEM AND METHOD OF DETERMINING A PROGRAMMING STEP SIZE FOR A WORD LINE OF A MEMORY

FIELD OF THE DISCLOSURE

The present disclosure is generally related to determining a programming step size for a word line of a memory.

BACKGROUND

Non-volatile memory devices, such as universal serial bus (USB) flash memory devices or removable storage cards, have allowed for increased portability of data and software applications. Flash memory devices can enhance data storage density and cost efficiency by storing multiple bits in each flash memory cell.

Storing multiple bits of information in a single flash memory cell typically includes mapping sequences of bits to states of the flash memory cell. After determining that a sequence of bits is to be stored into a particular flash memory cell, the flash memory cell may be programmed to a state corresponding to the sequence of bits. Programming the flash memory cell with a small programming step size may increase programming accuracy but may increase a number of programming steps, thereby increasing programming latency. Programming the flash memory cell with a large programming step size may decrease the number of programming steps, thereby decreasing programming latency, but may decrease programming accuracy. Once the memory cells in the memory device have been programmed, data may be read from the memory cells by sensing the programming state of the memory cells.

SUMMARY

A size of a programming step for a word line of a memory in a data storage device is determined at least partially based on a count of memory elements of the word line to be programmed to a particular state. A particular state being programmed into the word line a relatively high number of times compared to other states may be indicative of an increased likelihood of errors due to program disturbance or data retention. As a result, a tighter distribution of threshold voltages may be written to storage elements of the word line using a decreased programming step size as compared to a step size for data having a more uniform distribution of states, enabling programming data to the word line with reduced errors. Programming the word line with a large programming step size may decrease the number of programming steps, thereby decreasing programming latency. Programming the word line with a decreased programming step size may increase accuracy, reduce errors, and prolong the life of the memory.

DETAILED DESCRIPTION

Systems and methods of determining a programming step size at least partially in response to a count of memory elements of a word line to be programmed to a particular state are disclosed. Decreasing the programming step size may enable programming data to the word line with reduced errors by generating a tighter distribution of threshold voltages written to storage elements of the word line (e.g., as the memory ages).

Figure 1:
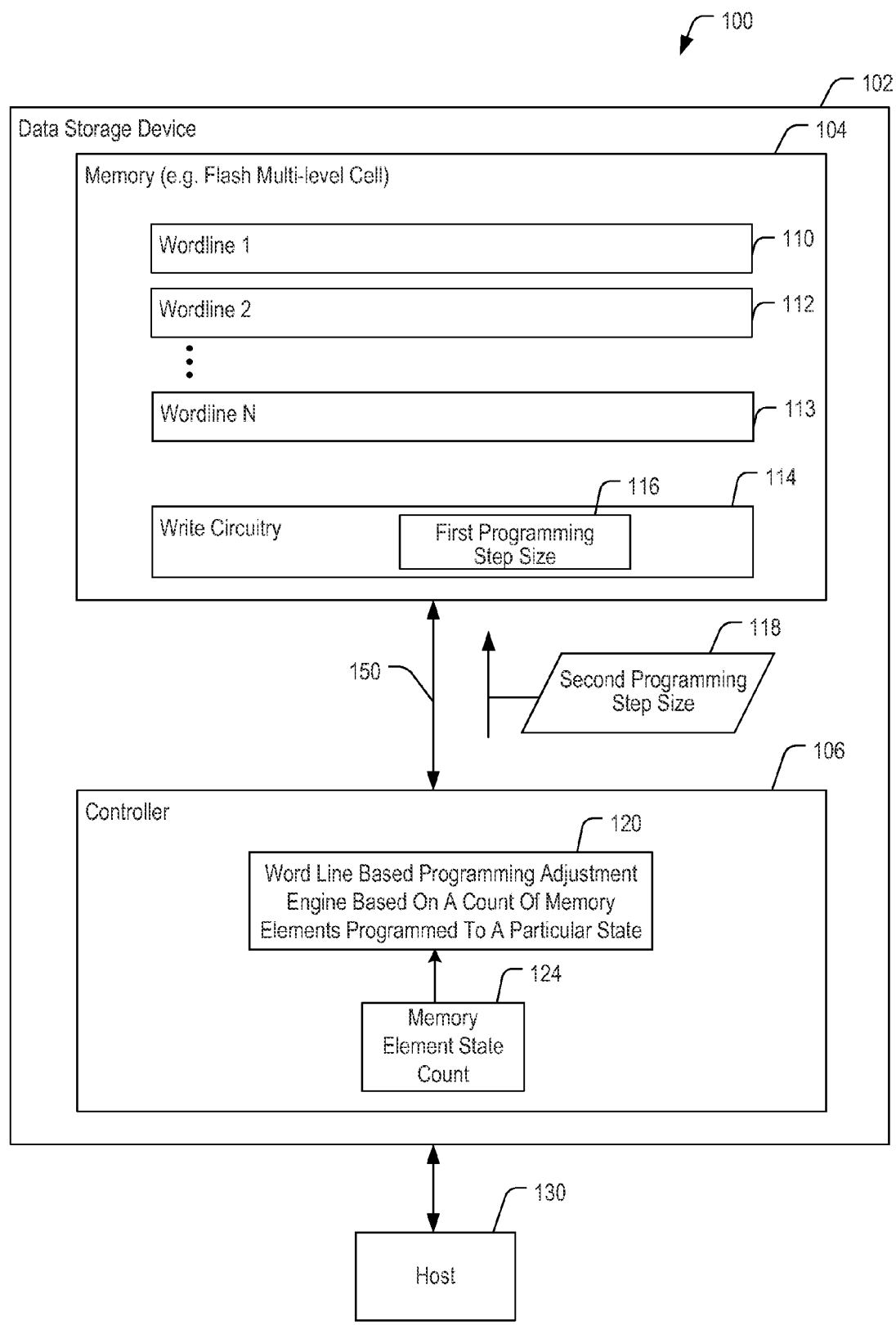
FIG. 1 is a block diagram of a first illustrative embodiment of a system to determine a programming step size for a word line of a memory in a data storage device at least partially based on a count of memory elements of the word line to be programmed to a particular state.

Referring to FIG. 1, a particular illustrative embodiment of a system configured to determine a programming step size for a word line of a memory in a data storage device at least partially based on a count of memory elements of the word line to be programmed to a particular state is depicted and generally designated 100. The programming step size may also be determined based on a second count of memory elements of the word line to be programmed to a second state. The system 100 includes a data storage device 102 coupled to a host device 130. The data storage device 102 includes a memory 104 coupled to a controller 106 via a bus 150.

The host device 130 may be configured to provide data to be stored at the memory 104 or to request data to be read from the memory 104. For example, the host device 130 may include a mobile telephone, a music or video player, a gaming console, an electronic book reader, a personal digital assistant (PDA), a computer such as a laptop computer, a notebook computer, or a tablet, any other electronic device, or any combination thereof.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be embedded memory in the host device 130, such as eMMC® (trademark of JEDEC Solid State Technology Association, Arlington, Va.) and eSD memory, as illustrative examples.

The memory 104 may be a non-volatile memory of a flash device, such as a NAND flash device, a NOR flash device, or any other type of flash device. The memory 104 includes a plurality of word lines, such as a first representative word line 110, a second representative word line 112, and an Nth representative word line 113. The memory 104 further includes write circuitry 114 configured to program data to one or more of the word lines 110, 112, 113 according to a programming step size. For example, the write circuitry 114 may program data to one or more of the word lines 110, 112, 113 via a sequence of programming pulses having a programming step size, such as a first programming step size 116, as described in further detail with respect to FIG. 2. The write circuitry 114 may be configured to store the first programming step size 116 as a default programming step size.

The write circuitry 114 may be configured to receive and use another programming step size, such as a second programming step size 118, from the controller 106 in place of the default programming step size. For example, the write circuitry 114 may be configured to program first data to the first word line 110 according to the first programming step size 116 and may be configured to program second data to the second word line 112 according to the second programming step size 118 (e.g., when the controller 106 writes data to the second word line 112 and sends the second programming step size 118 to the write circuitry 114 to perform such write operation). Thus the controller 106 may select the programming step size for data to be written to the memory 104 via the write circuitry 114 on a word line-by-word line basis.

The controller 106 may be configured to receive memory access requests from the host device 130 and to process data to be written to and read from the memory 104. The controller 106 includes a word line based programming adjustment engine 120 configured to receive a memory element state count 124. The word line based programming adjustment engine 120 may be configured to adjust a programming step size used by the write circuitry 114 at least partially based on the received memory element state count 124.

The word line based programming adjustment engine 120 may compare the memory element state count 124 to a threshold, and based on the result, the word line based programming adjustment engine 120 may determine the programming step size. For example, if the memory element state count 124 is less than the threshold, a first value of the programming step size, such as the first programming step size 116, may be selected to be provided to the memory 104. If the memory element state count 124 is greater than or equal to the threshold, a second value of the programming step size, such as the second programming step size 118, may be selected to be provided to the memory 104. The second programming step size 118 may be computed based on the memory element state count 124 or may be selected from a table, as described with respect to FIG. 3.

The controller 106 may be configured to decrease the programming step size from a first value to a second value for a word line of the memory 104 based on determining that a state count corresponding to the word line satisfies a threshold. For example, a relatively high state count corresponding to memory elements of the first word line 110 to be programmed to a particular state may be indicative of a higher likelihood of program disturbance errors or data retention errors. As described in further detail with respect to FIG. 2, program disturbance errors may be most likely to occur in cells programmed to a lowest voltage state of a plurality of voltage states of a particular memory element and data retention errors may be most likely to occur in cells programmed to a highest voltage state of the plurality of voltage states of a particular memory element.

When the memory element state count 124 corresponding to the first word line 110 satisfies a threshold, a size of the programming step for the first word line 110 may be decreased from the first programming step size 116 to the second programming step size 118. To illustrate, the word line based programming adjustment engine 120 may determine to adjust programming step size from the first programming step size 116 to the second programming step size 118 based on a result of comparing the received memory element state count 124 to a threshold. The controller 106 may send the second programming step size 118 to the write circuitry 114 for use in programming (i.e., writing data to) the first word line 110.

During operation, the host device 130 may instruct the controller 106 to write data corresponding to the first word line 110. The controller 106 may determine the memory element state count 124 based on the data to be written and may compare the memory element state count 124 to a threshold. If the memory element state count 124 satisfies the threshold, (e.g., the memory element state count 124 exceeds the threshold), a programming step size may be decreased from the first programming step size 116 to the second programming step size 118.

By decreasing the programming step size from a first value (e.g., the first programming step size 116) to a second value (e.g., the second programming step size 118) for a word line of a memory device, the number of programming steps and thus a programming latency may increase. However, as described with respect to FIG. 2, data programmed to the word line using a decreased programming step size may encounter fewer errors, prolonging the life of the memory device.

Figure 2:
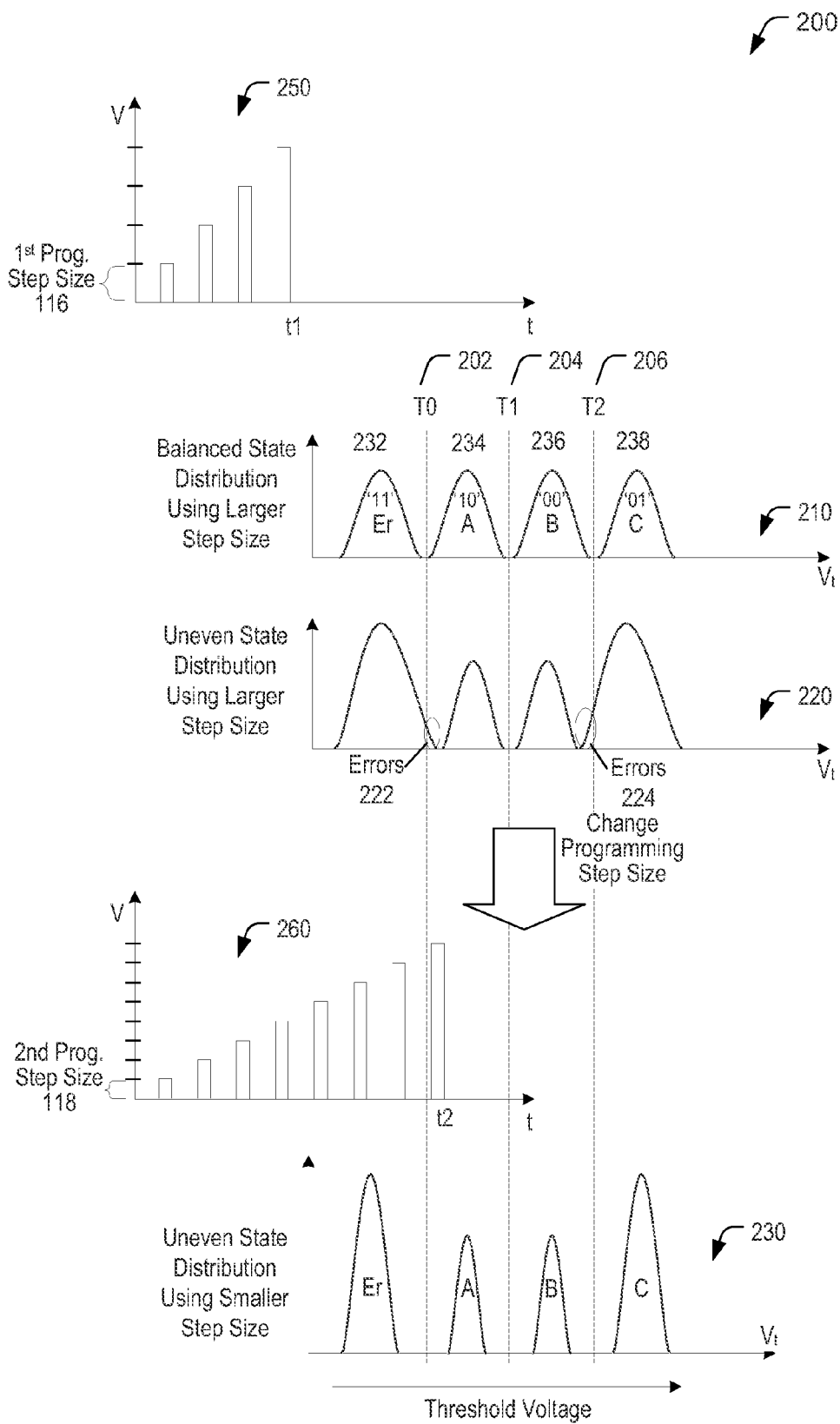
FIG. 2 is a general diagram illustrating representative voltage characteristics of a group of storage elements that may be read from a word line of the memory of FIG. 1 and illustrating reduction of bit errors by changing a programming step size.

FIG. 2 illustrates representative voltage characteristics 210, 220, and 230 of a group of storage elements that may be written to a word line of a memory, such as the first word line 110 of FIG. 1, and illustrates an effect of decreasing programming step size to reduce data corruption due to overlap in voltage threshold distributions. For example, threshold voltage characteristics that may be written to a group of multi-level cells (MLCs), such as a group of 2-bit cells, are illustrated in a first cell voltage distribution (CVD) 210. The first CVD 210 illustrates a distribution of cells to be programmed to particular threshold voltages using a first programming step size. For example, a first graphical representation 250 illustrates a sequence of programming pulses having a programming step size, such as the first programming step size 116. The first programming step size 116 indicates a first voltage value. The sequence of programming pulses may program one or more word lines, such as the first word line 110, of the memory 104 of FIG. 1. As an illustrative example, four programming pulses are shown. Each successive programming pulse is increased in voltage value by the voltage value of the first programming step size 116. To illustrate, a third programming pulse may have a voltage value that is equal to the first voltage value added to a voltage value of a second programming pulse. As illustrated, programming the first word line 110 may include a first programming latency or delay t1.

As illustrated, the first CVD 210 includes four representative threshold voltage ranges defined by three read voltages T0 202, T1 204, and T2 206 and corresponding to cell states "Er", "A", "B", and "C", respectively. For example, a 2-bit value of '11' may correspond to a threshold voltage within a first threshold voltage range 232 corresponding to the "Er" state, a 2-bit value of '10' may correspond to a threshold voltage within a second threshold voltage range 234 corresponding to the "A" state, a 2-bit value of '00' may correspond to a threshold voltage within a third threshold voltage range 236 corresponding to the "B" state, and a 2-bit value of '01' may correspond to a threshold voltage within a fourth threshold voltage range 238 corresponding to the "C" state. As illustrated, the first CVD 210 includes a substantially balanced state distribution. For example, a number of memory elements written to a word line corresponding to each of the cell states "Er", "A", "B", and "C", is substantially equal.

The first CVD 210 is illustrated as having no errors (i.e., all cells remain in their originally programmed state). Although each cell may be initially programmed to have a threshold voltage at a center of its respective threshold voltage range, the actual cell threshold voltages may "drift" from a center voltage due to a variety of factors, such as read disturbance or data retention.

The second CVD 220 represents another threshold voltage characteristic that may be written to the group of multi-level cells. The second CVD 220 illustrates a distribution of cells programmed to the particular threshold voltages using the first programming step size 116. As illustrated, the second CVD 220 includes an unbalanced state distribution. For example, a number of memory elements to be written corresponding to the "Er" state is substantially greater than a number of memory elements to be written corresponding to the "A" and "B" states, respectively. A number of memory elements to be written corresponding to the "C" state is substantially greater than the number of memory elements to be written corresponding to the "A" and "B" states, respectively.

Because program disturbance effects resulting from programming nearby cells are most likely to occur in a lowest voltage state (i.e., the "Er" state), a relatively high number of memory elements in the "Er" state as compared to the other states, and also a relatively high number of memory elements programmed to a highest voltage state (i.e., the "C" state), may be indicative of an increased likelihood of errors due to program disturbance. To illustrate, a first error region 222 includes errors that may occur in the storage elements of the word line for cells originally programmed to state "Er" whose threshold voltage has drifted across the read voltage T0 202 into another state due to cross-coupling effects caused by programming a nearby cell to a high voltage state. The programming disturbance may cause the threshold voltage of cells originally programmed to the "Er" state to drift or increase beyond the read voltage T0 202 between the "Er" state and the "A" state as shown.

Because data retention effects are most likely to occur in a highest voltage state (i.e., the "C" state), a relatively large number of memory elements to be programmed to the "C" state as compared to the other states may be indicative of an increased likelihood of errors due to data retention. To illustrate, a second error region 224 includes errors that may occur in the storage elements of the word line for cells originally programmed to state "C" whose threshold voltage has drifted across the read voltage T2 206 into another state. Data retention effects may cause the threshold voltage of cells originally programmed to the "C" state to drift or decrease beyond the read voltage T2 206 between the "B" state and the "C" state as shown, resulting in the cells being identified as storing '00' instead of '01'.

Another representative threshold voltage characteristic that may be written to the group of 2-bit multi-level cells of the second CVD 220 is illustrated in the third CVD 230, where the errors of the second CVD 220 have been reduced or avoided by a decrease in the programming step size used to program the cells to the particular threshold voltages, such as by the word line based programming adjustment engine 120 of FIG. 1. For example, a second graphical representation 260 illustrates a second sequence of programming pulses having a second programming step size that is decreased from the first programming step size 116, such as the second programming step size 118. The second programming step size 118 corresponds to a second voltage value that is less than the first voltage value. The first word line 110 may be programmed according to the second programming step size 118. As an illustrative example, eight programming pulses are shown. Each successive programming pulse is increased in voltage value by the voltage value of the second programming step size 118. As illustrated, programming the first word line 110 may include a second programming latency t2. The second programming latency t2 is greater than the first programming latency t1 due to an increased number of programming pulses.

The third CVD 230 illustrates a tighter distribution of threshold voltages to be written to the storage elements of a particular word line as compared to the distribution of threshold voltages in the first CVD 210. As such, more "drift" is required for cells to cross a border into another state. For example, more drift is required for cells programmed to the "C" state using the second programming step size 118 in the third CVD 230 to cross the read voltage T2 206 into another state (i.e., the "B" state) as compared to the "drift" required for cells to be programmed to the "C" state using the first programming step size 116 in the first CVD 210 to cross the read voltage T2 206 into the other state (i.e., the "B" state). Although FIG. 2 illustrates a 2-bit MLC having four states, other implementations, such as a 4-bit MLC, an 8-bit MLC, or any other MLC may be used.

By decreasing the programming step size of storage elements within a particular word line of a memory, a tighter distribution of threshold voltages written to the storage elements of the particular word line is achieved, which may enable programming data to the word line with reduced errors and prolonging the life of the memory.

Figure 3:
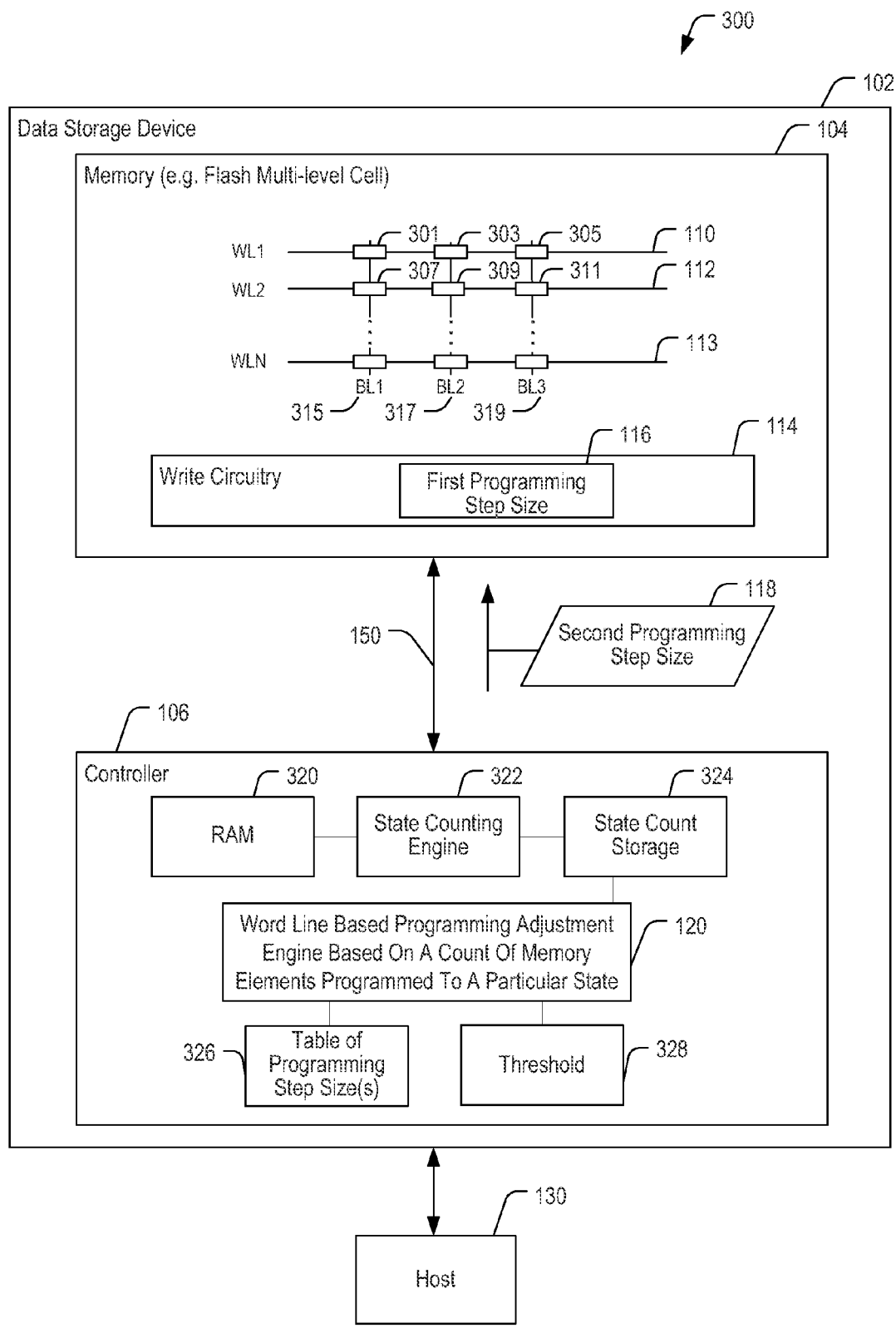
FIG. 3 is a block diagram of a second illustrative embodiment of a system to determine a programming step size for a word line of a memory in a data storage device at least partially based on a count of memory elements of the word line to be programmed to a particular state.

Referring to FIG. 3, a particular illustrative embodiment of the system of FIG. 1 showing additional detail of system components is depicted and generally designated 300. The system 300 includes the data storage device 102 coupled to the host device 130. The data storage device 102 includes the memory 104 coupled to the controller 106 via the bus 150.

The memory 104 includes the first word line 110, the second word line 112, and the Nth word line 113. The memory 104 also includes representative bit lines, including a first bit line 315, a second bit line 317, and a third bit line 319. Two or more of the first, second, and Nth word lines 110, 112, 113 may be physically adjacent to each other. Two or more of the first, second, and third bit lines 315, 317, 319 may be physically adjacent to each other. Representative storage elements are depicted at intersections of word lines and bit lines. To illustrate, representative storage elements 301 and 307 are coupled to the first bit line 315, representative storage elements 303 and 309 are coupled to the second bit line 317, and representative storage elements 305 and 311 are coupled to the third bit line 319. The representative storage elements 301-311 may include multiple multi-level cell storage elements of a flash memory device.

The memory 104 includes the write circuitry 114 and stores an indication of the first programming step size 116. For example, the write circuitry 114 may be configured to program first data to the first first word line 110 according to the first programming step size 116 and may be configured to program second data to the second word line 112 according to the second programming step size 118 (e.g., when the controller 106 writes data to the second word line 112 and sends the second programming step size 118 to the write circuitry 114 to perform such write operation). Thus, the controller 106 may select the programming step size for data to be written to the memory 104 via the write circuitry 114 on a word line-by-word line basis.

The controller 106 includes the word line based programming adjustment engine 120. The controller 106 further includes a random access memory (RAM) 320, a state counting engine 322, and state count storage 324. The RAM 320 may be configured to temporarily store a codeword (e.g., an error correction coding (ECC) codeword) corresponding to data indicated by the host device 130 to be written to the memory 104, such as data indicated to be written to the first word line 110. The state counting engine 322 may be configured to determine a number of storage elements within the first word line 110 to be programmed to a particular state. For example, the state counting engine 322 may be configured to access data stored in the RAM 320, determine the number of storage elements within the first word line 110 to be programmed to a particular state (e.g., the "Er" state of FIG. 2), and provide a state count to the state count storage 324. The state count storage 324 may provide the state count to the word line based programming adjustment engine 120.

For example, the state counting engine 322 may access each group of bits to be programmed to a single cell and determine which state the cell will be programmed to. For example, bits '01' for the cells of FIG. 2 indicate that a cell is to be programmed to state "C". The state counting engine 322 may maintain a separate counter for each state and increment each counter in response to detecting a bit pattern to be programmed to a cell. After all data to be programmed has been processed by the state counting engine 322, the resulting counter values may be stored to the state count storage 324 (e.g., a first counter value for the "Er" state, a second counter value for the "A" state, etc.).

When the state count corresponding to storage elements of the first word line 110 to be programmed to a particular state satisfies a threshold 328, a size of the programming step used when writing data to the first word line 110 may be decreased from the first programming step size 116 to the second programming step size 118. The threshold 328 may correspond to a percentage of a total number of cells to be programmed. To illustrate, the word line based programming adjustment engine 120 may adjust the programming step size from a first value (e.g., the first programming step size 116) to a second value (e.g., the second programming step size 118) at least partially based on the received threshold 328 and the received state count from the state count storage 324. For example, if the percentage of cells to be programmed to the "C" state using the first programming step size 116 is greater than the threshold 328 (e.g., greater than 30%), the word line based programming adjustment engine 120 may adjust the programming step size from the first programming step size 116 to the second programming step size 118.

As another example, if the percentage of cells to be programmed to the "Er" state using the first programming step size 116 is greater than another threshold 328 (e.g., greater than 35%), the word line based programming adjustment engine 120 may adjust the programming step size from the first programming step size 116 to the second programming step size 118.

Further, the word line based programming adjustment engine 120 may determine the programming step size based on a second count of memory elements of the first word line 110 to be programmed to a second state. For example, the programming step size may be decreased from the first programming step size 116 to the second programming step size 118 if a number of memory elements to be programmed to the "Er" state and corresponding to the "C" state is substantially greater than a number of memory elements to be written corresponding to the "A" and "B" states, respectively. For example, if a sum of the cells to be programmed to the "C" state and the "Er" state using the first programming step size 116 is greater than another threshold 328 (e.g., greater than 65%), the word line based programming adjustment engine 120 may adjust the programming step size from the first programming step size 116 to the second programming step size 118. Although example threshold values are described for illustrative purposes, any threshold values may be used based on theoretical calculation, simulation, actual test data, or a combination thereof, and may differ based on the type of memory (e.g., 2-bit MLC vs. 3-bit MLC).

The controller 106 may be configured to compute the second value based on the first value. For example, the second programming step size 118 may be computed based on a scaling factor multiplied by the first programming step size 116. To illustrate, the second programming step size 118 may be computed by multiplying the first programming step size 116 by a factor of 1.2 (e.g., the second value is 20% greater than the first value). In other implementations, the first programming step size 116 may be used as an index to retrieve the second programming step size 118 from a stored location, such as a table, a register, latches, etc.

The controller 106 may be configured to select the second value from a table of programming step size(s) 326. For example, the first value may be used as an index to retrieve the second value from the table of programming step size(s) 326. In other implementations, the second value may be selected from the table of programming step size(s) 326 based at least in part on a value of the memory element state count 124 of FIG. 1. To illustrate, if the value of the memory element state count 124 exceeds the threshold 328 by a large amount, the second value may be chosen from the table of programming step size(s) 326 such that the decrease from the first value is larger than the decrease would have been had the value of the memory element state count 124 exceeded the threshold 328 by a smaller amount. Although the table of programming step size(s) 326 is illustrated as within the controller 106, in other implementations, the table of programming step size(s) 326 may instead be within the memory 104.

During operation, the host device 130 may instruct the controller 106 to write data corresponding to the first word line 110. The controller 106 may determine the state count based on data to be written to the memory 104 and may compare the state count to a threshold. If the state count satisfies the threshold, (e.g., the state count exceeds the threshold), a programming step size may be decreased from the first programming step size 116 to the second programming step size 118.

Decreasing the programming step size of storage elements within a particular word line of a memory may enable programming data to the word line with fewer errors and prolonging the life of the memory.

Figure 4:
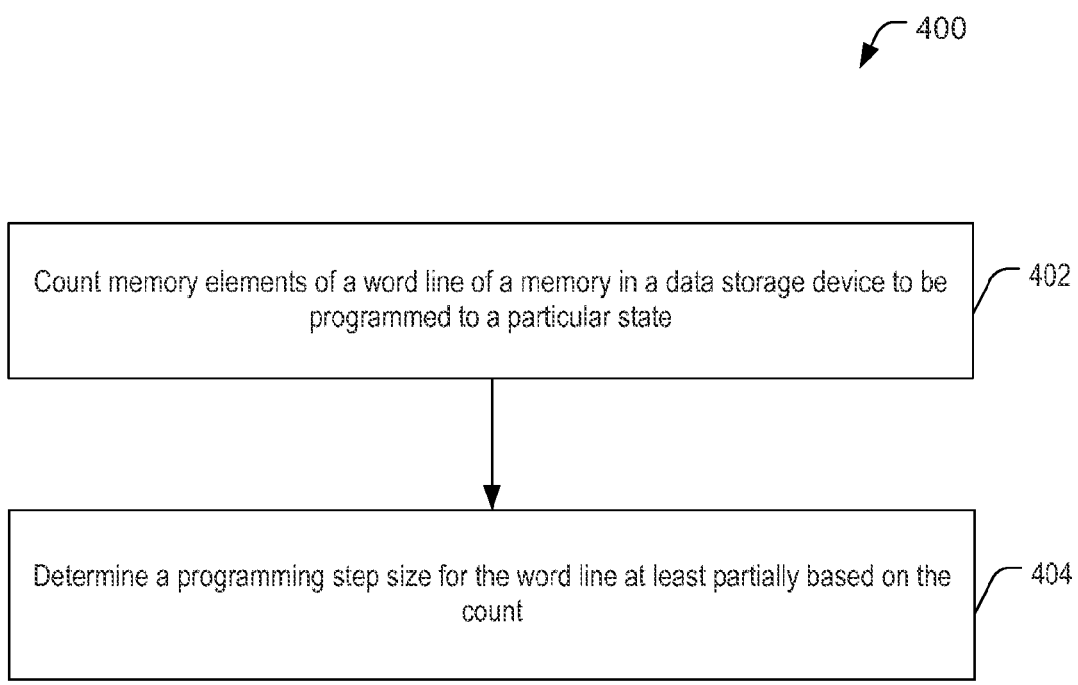
FIG. 4 is a flow diagram illustrating a particular embodiment of a method of determining a programming step size for a word line of a memory in a data storage device at least partially based on a count of memory elements of the word line to be programmed to a particular state.

FIG. 4 depicts a flowchart that illustrates an embodiment of a method 400 of determining a programming step size for a word line of a memory in a data storage device at least partially based on a count of memory elements of the word line to be programmed to a particular state. The method 400 may be performed by the data storage device 102 of FIG. 1 and FIG. 3.

A count of memory elements of a word line of a memory in a data storage device to be programmed to a particular state is determined, at 402. To illustrate, the state counting engine 322 of FIG. 3 may be configured to determine a number of storage elements within the first word line 110 to be programmed to a particular state by performing a decoding operation on a codeword stored in the RAM 320, and provide a state count to the word line based programming adjustment engine 120.

A programming step size for the word line is determined at least partially based on the count, at 404. To illustrate, the word line based programming adjustment engine 120 may compare the state count received from the state count storage 324 to the threshold 328, and based on the result, the word line based programming adjustment engine 120 may determine the programming step size. For example, in response to the state count being less than the threshold 328, the first programming step size 116 may be selected to be provided to the memory 104. In response to the state count being greater than or equal to the threshold 328, the second programming step size 118 may be selected to be provided to the memory 104.

Further, the word line based programming adjustment engine 120 may determine the programming step size based on a second count of memory elements of the first word line 110 to be programmed to a second state. For example, the programming step size may be decreased from a first value to a second value if a number of memory elements to be written corresponding to the "Er" state (e.g., indicative of an increased likelihood of errors due to program disturbance effects) and corresponding to the "C" state (e.g., indicative of an increased likelihood of errors due to data retention effects) is substantially greater than a number of memory elements to be written corresponding to the "A" and "B" states, respectively.

Programming the first word line 110 with a large programming step size may decrease the number of programming steps, thereby decreasing programming latency. Programming the first word line 110 with a decreased programming step size based on a count of memory elements of the first word line 110 to be programmed to a particular state may increase accuracy, reduce errors, and prolong the life of the memory.

Although various components depicted herein are illustrated as block components and described in general terms, such components may include one or more microprocessors, state machines, or other circuits configured to enable a data storage device, such as the data storage device 102 of FIG. 1 and FIG. 3, to perform the particular functions attributed to such components, or any combination thereof. For example, the controller 106 of FIG. 1 and FIG. 3 may represent physical components, such as controllers, processors, state machines, logic circuits, or other structures to instruct the word line based programming adjustment engine 120 to determine a programming step size for a word line based on a count of memory elements of the word line to be programmed to a particular state.

The controller 106 may be implemented using a microprocessor or microcontroller programmed to generate control information and to instruct the word line based programming adjustment engine 120. In a particular embodiment, the controller 106 includes a processor executing instructions that are stored at the memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be a portable device configured to be selectively coupled to one or more external devices. For example, the data storage device 102 may be a removable device such as a universal serial bus (USB) flash drive or removable memory card. However, in other embodiments, the data storage device 102 may be attached or embedded within one or more host devices, such as within a housing of a portable communication device. For example, the data storage device 102 may be within a packaged apparatus, such as a wireless telephone, a personal digital assistant (PDA), a gaming device or console, a portable navigation device, a computer, or other device that uses internal non-volatile memory. In a particular embodiment, the data storage device 102 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device, determining a programming step size for a word line of a memory at least partially based on a count of memory elements of the word line to be programmed to a particular state; and
   adjusting the programming step size, at a word line based programming adjustment engine, at least partially based on threshold data and the count of memory elements.

2. The method of claim 1, wherein decreasing the programming step size and increasing a number of programming steps enables programming data to the word line with reduced errors by generating a tighter distribution of threshold voltages written to memory elements of the word line.

3. The method of claim 1, wherein determining the programming step size includes:
   selecting a first value of the programming step size in response to determining that the count is less than a threshold; and
   selecting a second value of the programming step size in response to determining that the count is greater than or equal to the threshold, wherein the second value is less than the first value.

4. The method of claim 1, wherein determining the programming step size is further based on a second count of memory elements of the word line to be programmed to a second state.

5. The method of claim 1, wherein the particular state is a lowest voltage state of a plurality of voltage states of the memory elements.

6. The method of claim 1, wherein the particular state is a highest voltage state of a plurality of voltage states of the memory elements.

7. The method of claim 1, further comprising selecting the programming step size from a table.

8. The method of claim 7, wherein the table is in the memory of the data storage device.

9. The method of claim 7, wherein the table is in a controller of the data storage device.

10. The method of claim 1, further comprising computing the programming step size based at least partially on the count.

11. A data storage device comprising:
    a memory;
    a controller configured to determine a programming step size for a word line of the memory at least partially based on a determination by the controller of a count of memory elements of the word line to be programmed to a particular state; and a word line based programming adjustment engine configured to adjust the programming step size at least partially based on threshold data and the count of memory elements.

12. The data storage device of claim 11, further comprising write circuitry configured to program data to the word line according to the programming step size.

13. The data storage device of claim 11, further comprising a state counting engine configured to provide state count data to the word line based programming adjustment engine.

14. The data storage device of claim 11, wherein the controller is further configured to:
select a first value of the programming step size in response to a determination that the count is less than a threshold; and
select a second value of the programming step size in response to a determination that the count is greater than or equal to the threshold, wherein the second value is less than the first value.

15. The data storage device of claim 11, wherein the controller is further configured to determine the programming step size based on a second count of memory elements of the word line to be programmed to a second state.

16. The data storage device of claim 11, wherein the particular state is a lowest voltage state of a plurality of voltage states of the memory elements.

17. The data storage device of claim 11, wherein the particular state is a highest voltage state of a plurality of voltage states of the memory elements.

18. The data storage device of claim 11, wherein the controller is further configured to select the programming step size from a table based on the count.

19. The data storage device of claim 11, wherein the controller is further configured to compute the programming step size based at least partially on the count.

* * * * *